(12) United States Patent
Qiu et al.

(10) Patent No.: US 8,344,777 B2
(45) Date of Patent: Jan. 1, 2013

(54) METHOD AND APPARATUS FOR ADAPTIVELY MODIFYING A PULSE WIDTH OF A PULSE WIDTH MODULATED OUTPUT

(75) Inventors: Weihong Qiu, San Jose, CA (US); Chun Cheung, Brooklyn, NY (US); Emil Chen, Mountain View, CA (US)

(73) Assignee: Intersil Americas Inc., Milpitas, CA (US)

( * ) Notice: Subject to any disclaimer, the term of this patent is extended or adjusted under 35 U.S.C. 154(b) by 186 days.

(21) Appl. No.: 12/858,181

(22) Filed: Aug. 17, 2010

(65) Prior Publication Data
US 2011/0204947 A1    Aug. 25, 2011

Related U.S. Application Data

(60) Provisional application No. 61/307,586, filed on Feb. 24, 2010.

(51) Int. Cl.
    *H03K 3/017* (2006.01)
(52) U.S. Cl. ............ 327/174; 327/176; 327/177
(58) Field of Classification Search ........... 327/172, 327/174–177
    See application file for complete search history.

(56) References Cited

U.S. PATENT DOCUMENTS

| | | | | |
|---|---|---|---|---|
| 5,969,555 A * | 10/1999 | Suda | | 327/172 |
| 6,038,255 A * | 3/2000 | Palmer et al. | | 375/238 |
| 6,182,235 B1 * | 1/2001 | Ma et al. | | 713/501 |
| 6,700,423 B1 * | 3/2004 | Miki et al. | | 327/172 |
| 6,937,084 B2 * | 8/2005 | Bowling | | 327/393 |
| 7,109,769 B2 * | 9/2006 | Goto et al. | | 327/175 |
| 7,279,947 B2 * | 10/2007 | Chiu et al. | | 327/172 |
| 7,432,752 B1 * | 10/2008 | Lee et al. | | 327/175 |
| 2006/0152262 A1 * | 7/2006 | Park | | 327/172 |
| 2011/0193605 A1 * | 8/2011 | Zhao | | 327/175 |

* cited by examiner

*Primary Examiner* — Lincoln Donovan
*Assistant Examiner* — William Hernandez
(74) *Attorney, Agent, or Firm* — Fogg & Powers LLC

(57) ABSTRACT

Systems, methods, and apparatus for improving steady state operation of a pulse width modulator during transient and soft start events are described herein. An apparatus can include a phase component configured to adaptively modify a pulse width of a first pulse width modulated (PWM) output signal based on a pulse width of a PWM input signal. Further, the apparatus can include a power stage component configured to source at least one of a voltage or a current to a load based on the first PWM output signal. In one example, the phase component can be configured to linearly extend the pulse width of the first PWM output signal based on the pulse width of the PWM input signal. In another example, the phase component can be configured to adaptively modify the pulse width of the first PWM output signal based on a predetermined maximum pulse width.

24 Claims, 15 Drawing Sheets

METHOD AND APPARATUS FOR ADAPTIVELY MODIFYING A PULSE WIDTH OF A PULSE WIDTH MODULATED OUTPUT

PRIORITY CLAIM

This application claims priority to U.S. Provisional Patent Application Ser. No. 61/307,586, filed on Feb. 24, 2010, and entitled "METHOD AND APPARATUS FOR LINEARLY EXTENDING PULSE WIDTHS OF PWM PULSES FOR HIGH DUTY CYCLE APPLICATIONS," the entirety of which is incorporated by reference herein.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
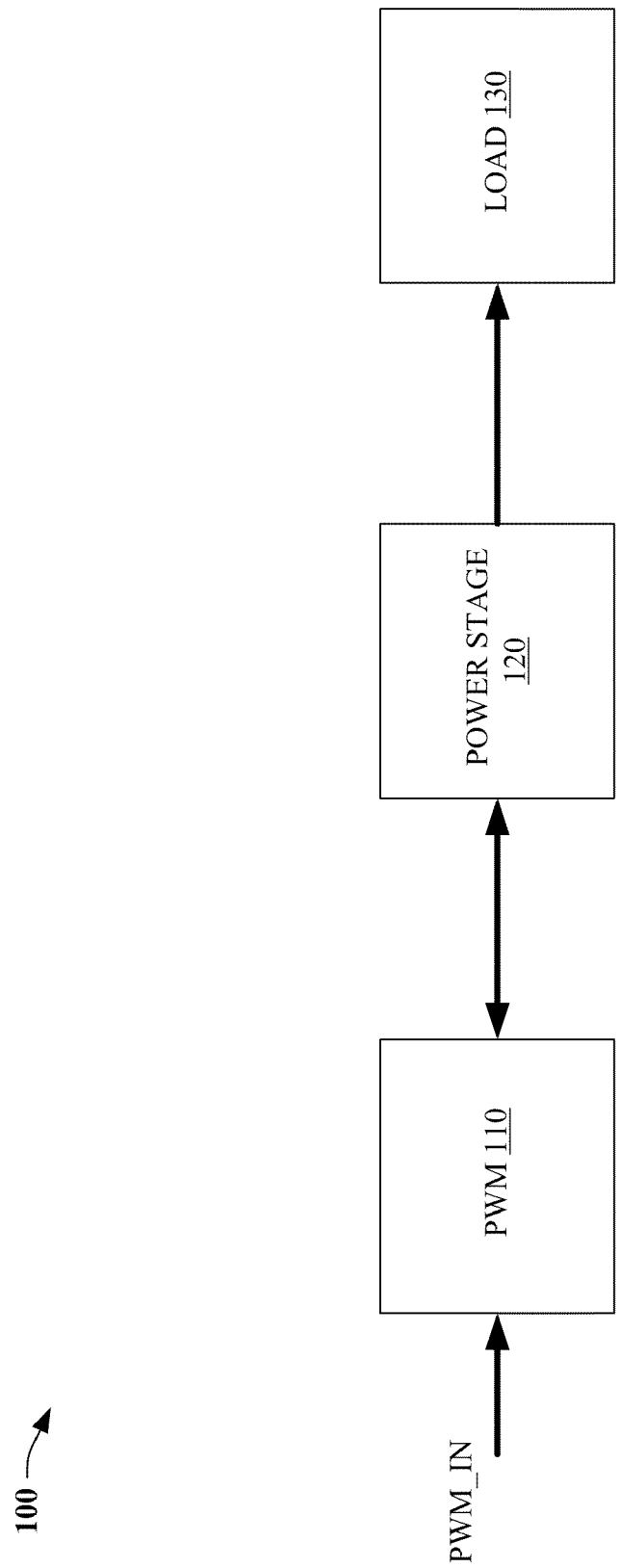
FIG. 1 illustrates a block diagram of a power supply environment, in accordance with an embodiment.

Various non-limiting embodiments of systems, methods, and apparatus presented herein adaptively modify a pulse width of an output of a pulse width modulator.

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

The systems and processes described below can be embodied within hardware, such as a single mixed-signal integrated circuit (IC) chip, multiple ICs, an application specific integrated circuit (ASIC), or the like. Further, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

The subject disclosure relates to systems, methods, and apparatus that adaptively modify an output of a pulse width modulator. The pulse width modulator can modulate a "duty cycle" of a square wave, or pulse train, to control an amount of voltage and/or current taken by the load. The term duty cycle refers to a proportion of time, or "ON time", of the pulse train divided by a period of the pulse train. Current and/or voltage is taken by the load from the input source during the ON time of the pulse train, e.g., via power transistor(s) coupled to the pulse width modulator. Further, when duty cycle is expressed in percent, for example, 100% duty cycle refers to power taken from the input source during a complete cycle of the square wave.

A phase doubler is a pulse width modulator that can modulate two-phase pulse trains, or power trains, based on a single pulse width modulated (PWM) input signal. For example, two PWM signals are generated by the phase doubler to drive complementary power stages coupled to a load—the power stages providing voltage and current to the load, e.g., via an inductor and a capacitor. As such, conventional phase doublers limit an effective duty cycle of each generated pulse width modulated signal to 50%. Further, if phase doublers are cascaded to modulate four-phase power trains based on a single PWM input signal, an effective duty cycle of each PWM signal generated by the cascaded phase doublers is limited to 25%. Moreover, propagation delays and driver "dead time" associated with power stage(s) coupled to a phase doubler configuration can further limit the effective duty cycle of each PWM signal generated by the phase doubler configuration.

Conventional pulse width modulation techniques can overcome such duty cycle limitations by adding a fixed extension time to every ON time associated with a pulse generated by each output signal of a phase doubler, effectively increasing the duty cycle of the output signal; however, such techniques can result in reduced pulse width modulator performance during soft start and transient events. Soft start is a technique that can limit current during initial power-up of a circuit.

For example, during soft start of a pulse width modulator—in which an output of the pulse width modulator controls power applied to a voltage source—the duty cycle of the output can be gradually increased; however, such soft start involving a conventional pulse width modulator can result in undesirable oscillation (or sudden change(s)) at the output when the pulse width modulator extends the ON time of the output by the fixed extension time—the undesirable oscillation or sudden change(s) interfering with power up of the voltage source.

Further, during steady state operation, conventional pulse width modulation techniques that extend the ON time of the output by the fixed extension time can cause excessive voltage and/or current spikes at the output of the pulse width modulator during a transient event, e.g., an event during which a load coupled to the output of the pulse width modulator is switched from a high current load to a low current load, e.g., 100 amperes to 10 amperes.

Compared to such conventional pulse width modulation technologies, various systems, methods, and apparatus described herein can adaptively modify a pulse width of an output of a pulse width modulator, for example, to improve soft start operation of the pulse width modulator and/or steady state operation of the pulse width modulator during transient event(s). For example, and referring now to FIG. 1, a block diagram of power supply environment 100 including pulse width modulator 110 is illustrated, in accordance with an embodiment. pulse width modulator 110 can couple to power stage 120, which can provide voltage and/or current to load 130, e.g., an electronic circuit comprising one or more ICs. Further, pulse width modulator 110 can adaptively modify a pulse width of an output signal of pulse width modulator 110 based on a pulse width of an input signal received by pulse width modulator 110. The output signal can be received by power stage 120, and power stage 120 can source the voltage and/or the current to load 130 based on the output signal. As such, pulse width modulator 110 can improve performance of power supply environment during soft start and/or steady state operation.

Figure 2:
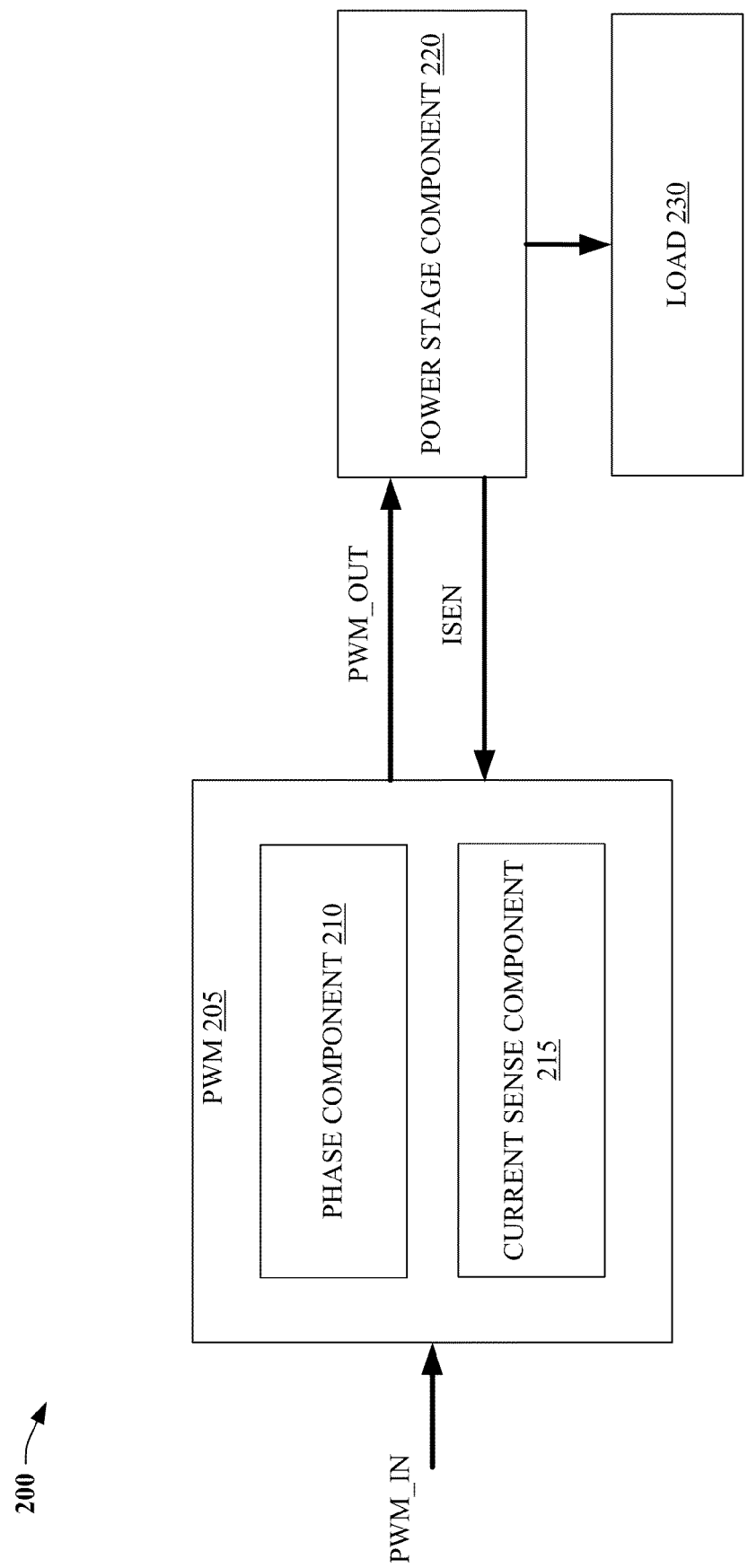
FIG. 2 illustrates a block diagram of a power system, in accordance with an embodiment.

FIG. 2 illustrates a block diagram of a power system 200, in accordance with an embodiment. Power system 200 can include pulse width modulator 205, which can include phase component 210 and current sense component 215. In one embodiment, pulse width modulator 205 can couple to power stage component 220 via one or more pulse width modulated output ("PWM_OUT") signals. Power stage component 220 can receive the PWM_OUT signal(s) as input, e.g., by way of an inductor (not shown), and source voltage and/or current to load 230. In one embodiment, power stage component 220 can include at least one transistor, e.g., metal-oxide-semiconductor field-effect transistor (MOSFET), etc. of a power supply, e.g., a switched-mode power supply, a buck converter, a boost converter, a buck-boost converter, a voltage regulator, etc. controlled by pulse width modulator 205. In another embodiment, load 230 can include one or more electronic devices, e.g., an integrated circuit, a microcontroller, a central processing unit (CPU), a motor, etc. requiring voltage and/or current provided by power stage component 220.

Pulse width modulator 205 can receive a pulse width modulated input signal ("PWM_IN"), and phase component 210 can adaptively modify and/or generate the PWM_OUT signal(s), e.g., to improve soft start operation of pulse width modulator 205 and/or steady state operation of pulse width modulator 205 during transient events associated with power stage component 220 and/or load 230. For example, in one embodiment, phase component 210 can generate a PWM_OUT signal of the PWM_OUT signal(s) based on a pulse width (or ON time) of the PWM_IN signal, the PWM_OUT signal having an ON time, or pulse width, larger than the pulse width of the PWM_IN signal. In another embodiment, phase component 210 can generate the PWM_OUT signal having an ON time larger for a larger pulse width of the PWM_IN signal than for a smaller pulse width of the PWM_IN signal.

In yet another embodiment, phase component 210 can generate the PWM_OUT signal having an ON time proportional to the pulse width of the PWM_IN signal. For example, in one embodiment, phase component 210 can generate a PWM_OUT signal that increases linearly as a function of the pulse width of the PWM_IN signal. In another embodiment, phase component 210 can limit, or prevent, a pulse width of the PWM_OUT signal from exceeding a predetermined maximum value, e.g., associated with a switching period, or cycle time, of the PWM_IN signal.

In yet another embodiment, current sense component 215 can sense a current, e.g., via a current sense input ("ISEN") received from power stage component 220, which can be associated with and/or generated by the PWM_OUT signal. Further, phase component 210 can switch a pulse of the PWM_OUT signal from a high level to a low level when the current exceeds a predetermined maximum value—the switching of the pulse of the PWM_OUT signal from the high level to the low level causing the PWM_OUT signal to stop generating current associated with the PWM_OUT signal and/or to reduce current flow associated with the PWM_OUT signal.

Figure 3:
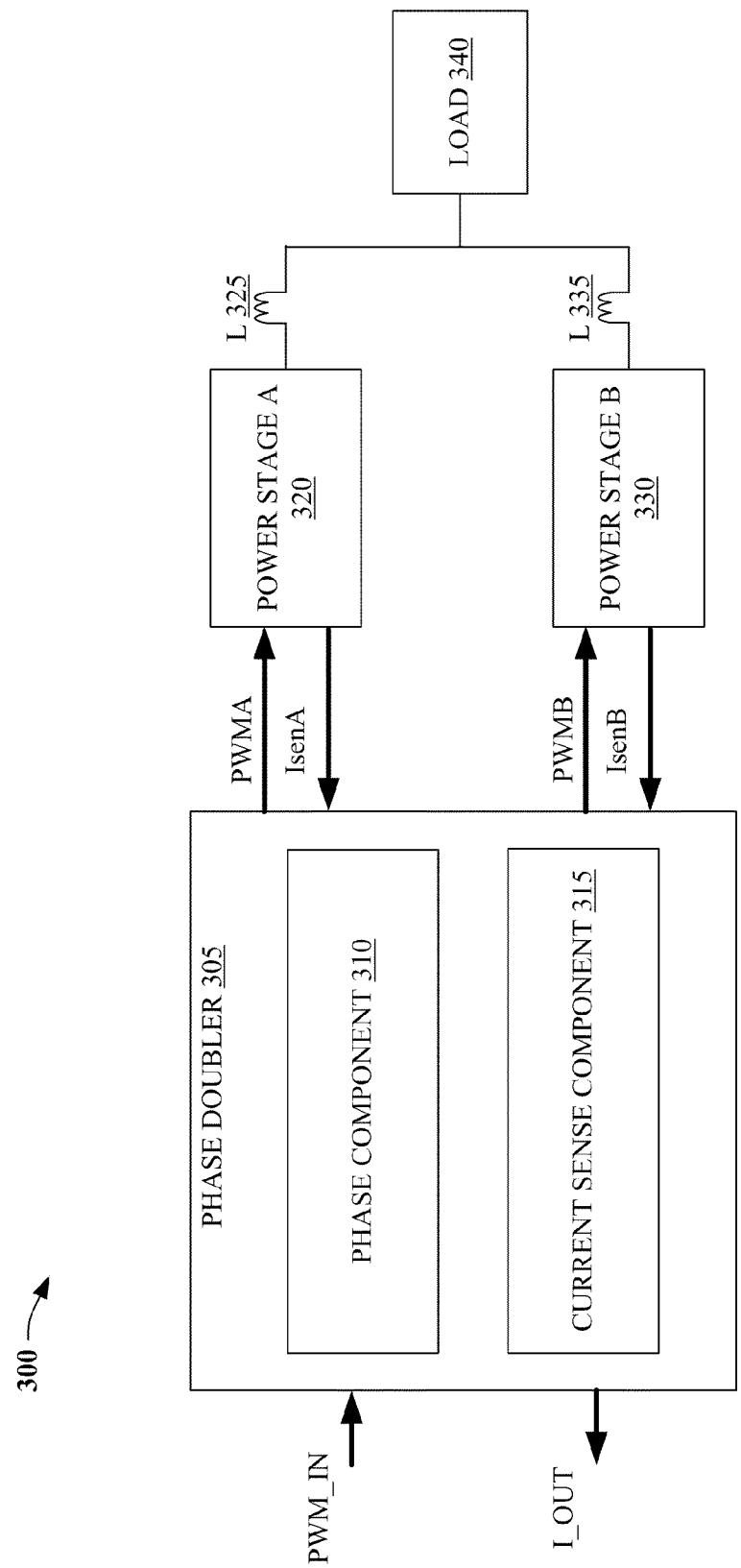
FIG. 3 illustrates a block diagram of another power system, in accordance with an embodiment.

FIG. 3 illustrates a block diagram of another power system (300), in accordance with an embodiment. Power system 300 can include phase doubler 305 that can include phase component 310 and current sense component 315. In one embodiment, phase component 310 can perform functions similar to those described above regarding phase component 110, e.g., for controlling each pulse width modulated signal, or power train PWMA and PWMB, based on PWM input signal PWM_IN.

Figure 4:
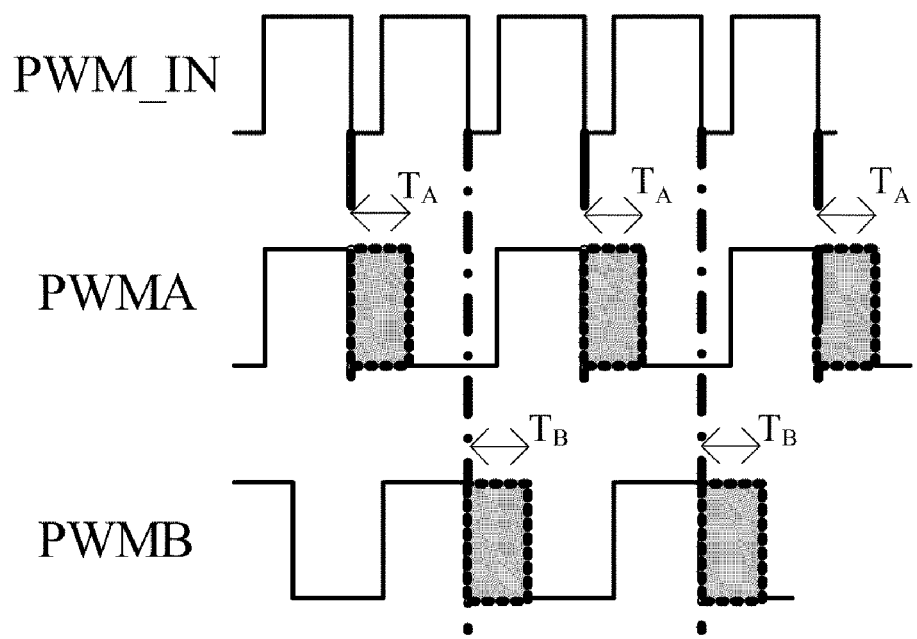
FIG. 4 illustrates waveforms associated with a phase doubler, in accordance with an embodiment.

For example, and referencing waveforms 400 illustrated by FIG. 4, phase doubler 305 can generate complementary pulse width modulated output signals PWMA and PWMB to drive power stage A 320 and power stage B 330, respectively. Further, power stage A 320 and power stage B 330 can be coupled to load 340, via inductors 325 and 335. Furthermore, current is typically supplied to load 340 when the PWMA output signal or the PWMB output signal is HIGH, or ON. Phase doubler 305 performance regarding propagation delay and/or component variation, e.g., associated with power stage A 320 and power stage B 330, can be improved by ensuring that output load current of phase doubler 305 is equally shared, or substantially shared within predetermined threshold(s), between power stage A 320 and power stage B 330.

Accordingly, phase doubler 305 can perform current balancing functions via current sense component 315, in addition to adaptively modifying and/or generating output signals PWMA and PWMB (see, e.g., $T_A$ and $T_B$ illustrated by FIG. 4), e.g., similar to the adaptive modification and/or generation of output signal PWM_OUT performed by phase component 210 (see above).

For example, in an embodiment, current sense component 315 can sense current carried by power stage A 320 and power stage B 330 based on feedback signals IsenA and IsenB, respectively. Based on the current sensed via current sense component 315, phase doubler 305 can match, or balance, currents provided via PWMA and PWMB by extending one of the PWM output voltage signals, either PWMA or PWMB. For example, if PWMA has 5 nanoseconds (ns) of rising delay more than PWMB, then phase component 310 can provide a wider output voltage pulse at PWMB, even if a constant sized PWM_IN voltage pulse is provided to phase doubler 305. As such, 5 ns can be added at the end of the HIGH, or ON portion, of every PWMB pulse output, so that currents generated by pulses PWMA and PWMB can more closely match.

In one embodiment, phase doubler 305 of power system 300 can be implemented on a single mixed-signal IC. In another embodiment, phase doubler 305 can be implemented via multiple ICs.

Figure 5:
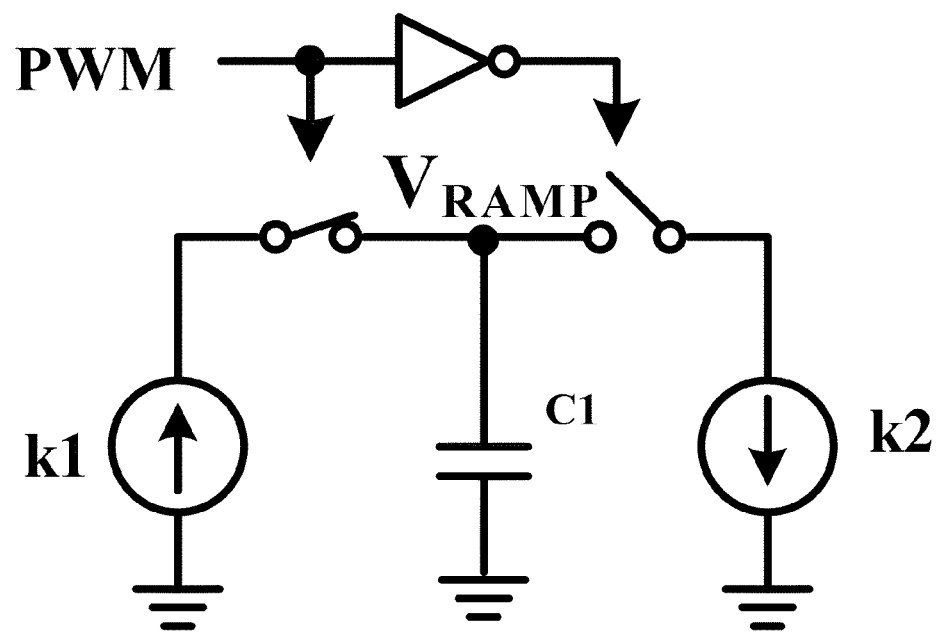
FIG. 5 illustrates circuitry associated with a linear pulse width modulation extension scheme, in accordance with an embodiment.
Figure 6:
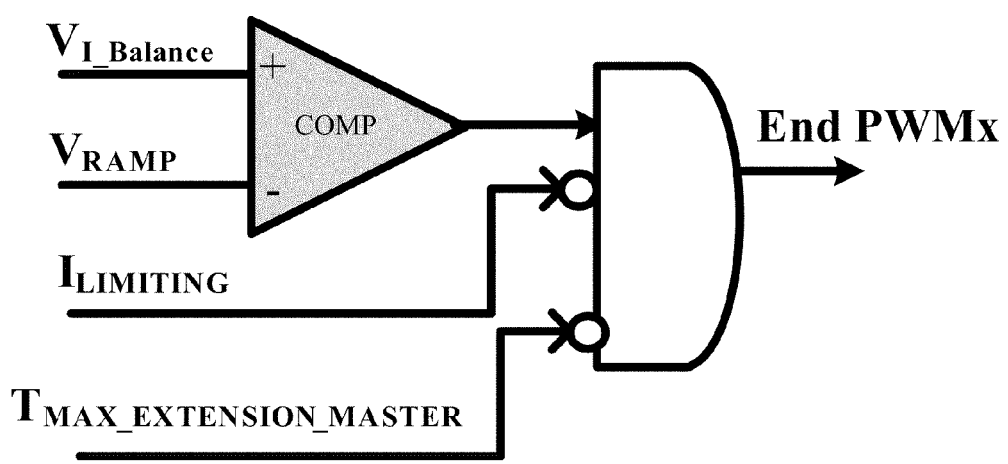
FIG. 6 illustrates other circuitry associated with the linear pulse width modulation extension scheme, in accordance with an embodiment.
Figure 7:
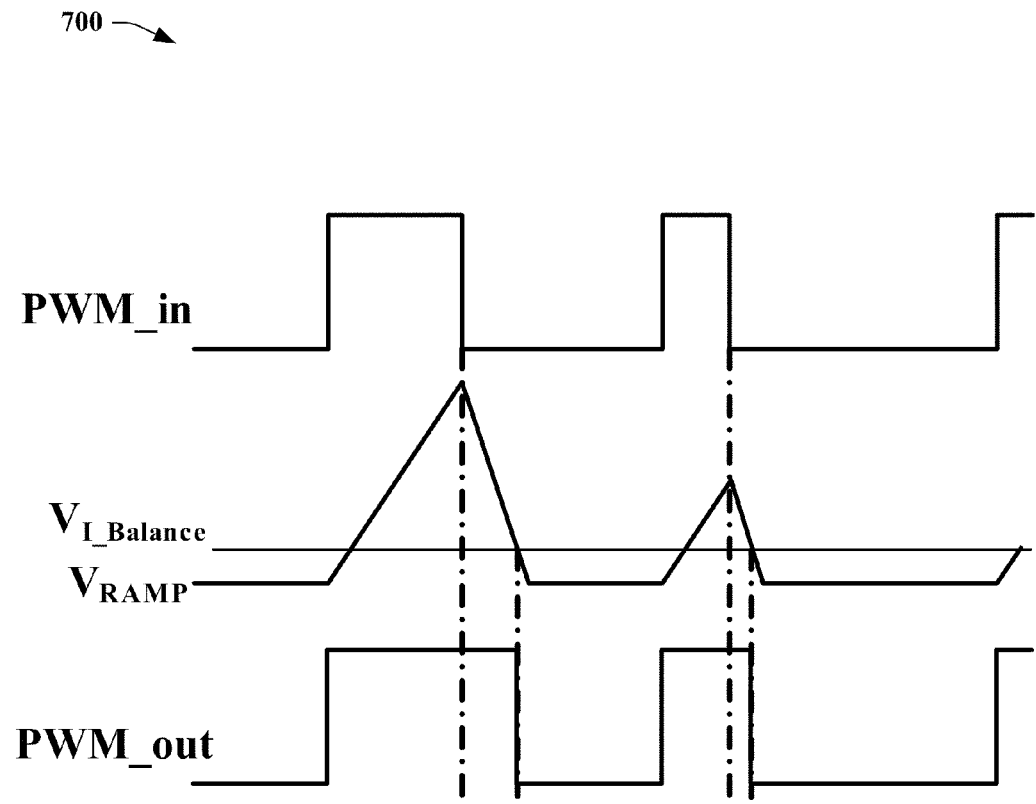
FIG. 7 illustrates waveforms associated with the linear pulse width modulation extension scheme, in accordance with an embodiment.

Now referring to FIGS. 5-7, a linear pulse width modulation extension scheme that can be implemented by phase components (210, 310) and current sense components (215, 315) is illustrated, in accordance with an embodiment. FIG. 5 illustrates circuitry 500, in which current source k1 charges capacitor C1 when PWM input pulse, e.g., PWM_IN, is HIGH. The value of the voltage on capacitor C1 can be referred to as $V_{RAMP}$. As demonstrated by waveforms 700 illustrated by FIG. 7, PWM output pulse (PWM_out), e.g., PWM_OUT, PWMA, or PWMB, does not immediately become LOW when the PWM input pulse (PWM_in) becomes LOW, as the PWM output pulse is typically latched high during a rising edge of the PWM output pulse. Rather, the PWM output pulse goes LOW when an EndPWMx signal goes HIGH, via circuitry 600 illustrated by FIG. 6. When the PWM input pulse becomes LOW, the charging current source k1 is disconnected from the $V_{RAMP}$ node and the discharging current source k2 is connected to the $V_{RAMP}$ node, thereby causing C1 to discharge and the value of $V_{RAMP}$ to fall. When $V_{RAMP}$ falls below the value of $V_{I\_Balance}$/comparator COMP output goes HIGH, thereby causing the PWM output pulse to go LOW (see FIG. 7). The value of $V_{I\_Balance}$ can be based on current balance circuitry, e.g., associated with current sense component 315 described above.

For example, if a phase (or power train), e.g., PWMA, PWMB, etc. is detected via current sense components (215, 315) to have a smaller current compared to a current associated with a complement of the phase, the value of $V_{I\_Balance}$ can be reduced to increase the extension time (e.g., $T_A$, $T_B$) of a pulse of the power train. Further, in an embodiment illustrated by FIG. 6, circuitry 600 can cause the PWM output pulse to go LOW based on a maximum current $I_{LIMITING}$, which can be programmable. In one embodiment, $I_{LIMITING}$ can be based on current balance gain, regardless of an increase in extension time of the pulse of the power train; and/or regardless of current balancing functions performed by phase doubler 305 described above.

In another embodiment, the amount of extension time can increase for increasing pulse widths. In yet another embodiment illustrated by FIG. 6, circuitry 600 can include a master maximum extension ($T_{MAX\_EXTENSION\_MASTER}$) input (or function), e.g., associated with each output PWM pulse. The master maximum extension input, for example, can prevent the extension time of the pulse of a power train from exceeding the cycle time of the PWM input pulse. In one embodiment, the master maximum extension input can be utilized if output current balance is sensed, via current sense component 315, outside of predetermined threshold(s). In another embodiment, the current limiting ($I_{LIMITING}$) function and the master maximum extension function can be utilized to avoid PWM extensions or phase current runaway.

Compared to conventional pulse width modulator technology, embodiments of the linear pulse width modulation extension schemes disclosed herein provide for improved soft start and improved current balancing during high frequency transient events. By linearly adjusting the extension time, embodiments of the present invention allow for cleaner soft-starts and also reduce overshoots during transient events. For example, the higher the duty cycle of a PWM input pulse, the more the extension time of a phase can be increased. In another example, the extension time of the phase can be increased if a current provided via a phase is less than a current provided via a complement of the phase. As such, embodiments disclosed herein can improve pulse width modulator output soft start behaviors and pulse width modulator performance during load transient events, e.g., load release events associated with a transition from a higher load to a lower load.

Further, the current limiting ($I_{LIMITING}$) function described above can be utilized to end a phase (or PWM output pulse) early, before the phase is over stressed. Moreover, the current limiting function can improve current balance among phases, e.g., of phase doubler 305, or of a cascaded configuration of phase doublers described below (see, e.g., FIG. 11) during load transient events.

Figure 8:
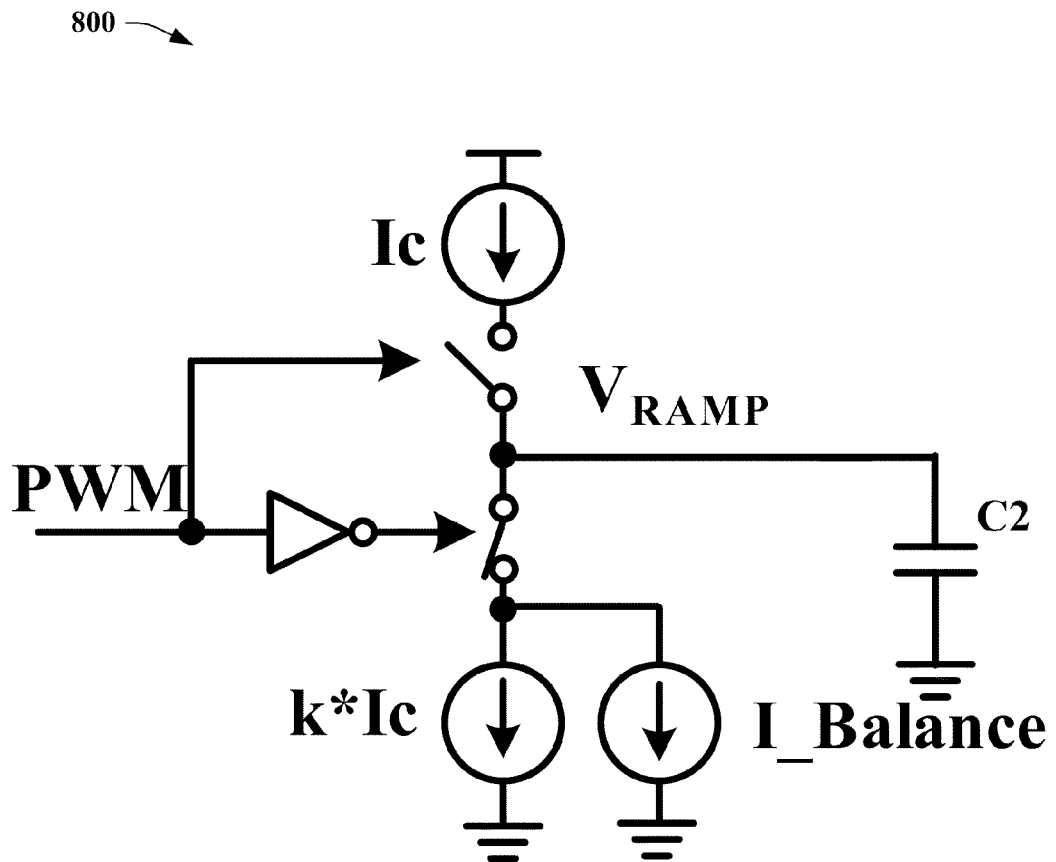
FIG. 8 illustrates circuitry associated with an other linear pulse width modulation extension scheme, in accordance with an embodiment.
Figure 9:
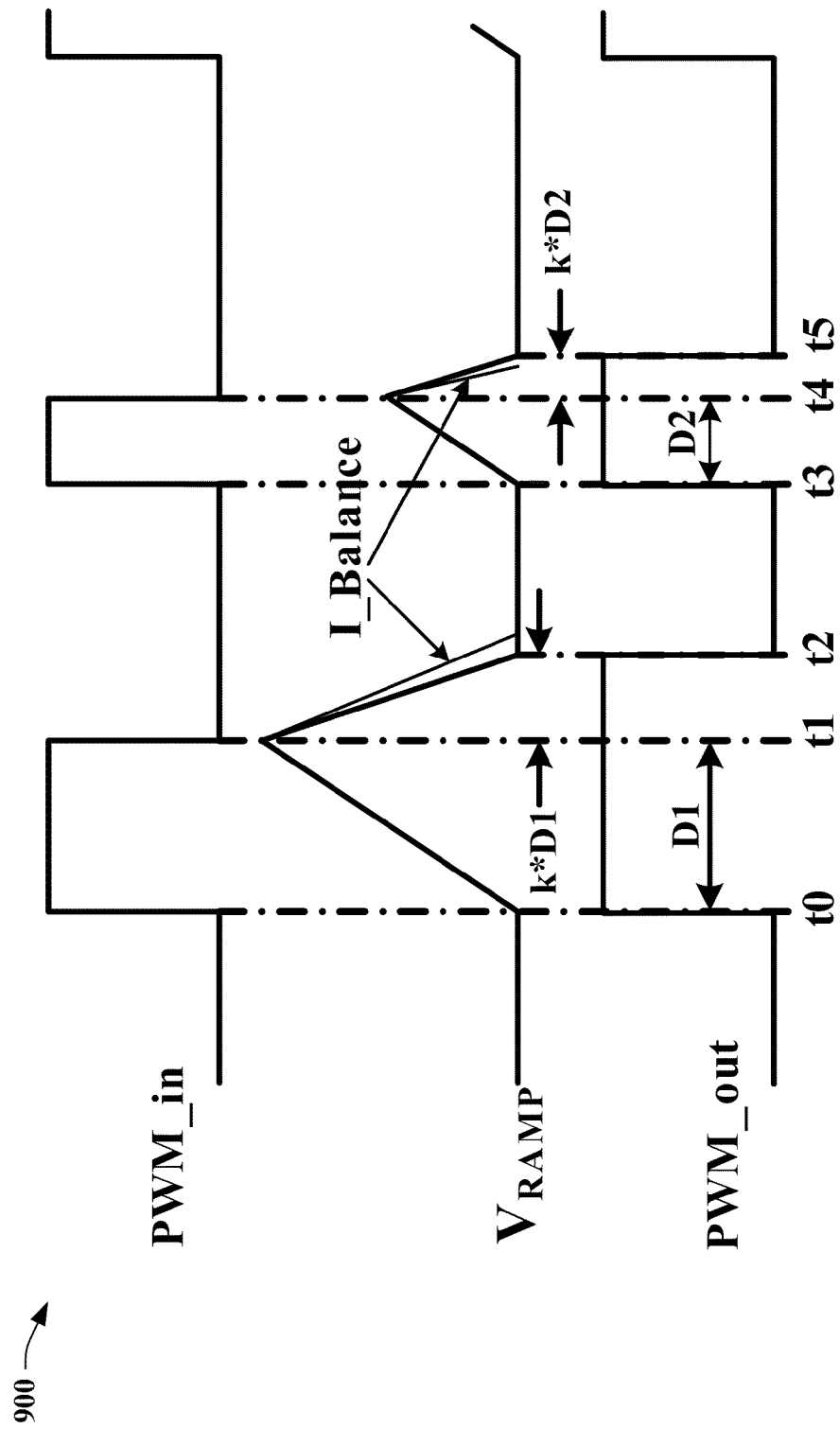
FIG. 9 illustrates waveforms associated with the other linear pulse width modulation extension scheme, in accordance with an embodiment.

Referring now to FIGS. 8 and 9, another linear pulse width modulation extension scheme, which can be implemented via phase components (210, 310) and current sense components (215, 315), is illustrated, in accordance with an embodiment. Similar to the linear pulse width modulation extension scheme discussed above with respect to FIGS. 5-7, capacitor C2 of circuitry 800 can be charged when the PWM input pulse is HIGH; however, compared to the previously discussed linear pulse width modulation extension scheme, current balance information (I__Balance), e.g., associated with $V_{I\_Balance}$, can be used to adjust the down slope of the discharge current of C2—rather than a voltage level. As demonstrated by waveforms 900 illustrated by FIG. 9, the PWM output pulse goes low when $V_{RAMP}$ returns to its original value.

Figure 10:
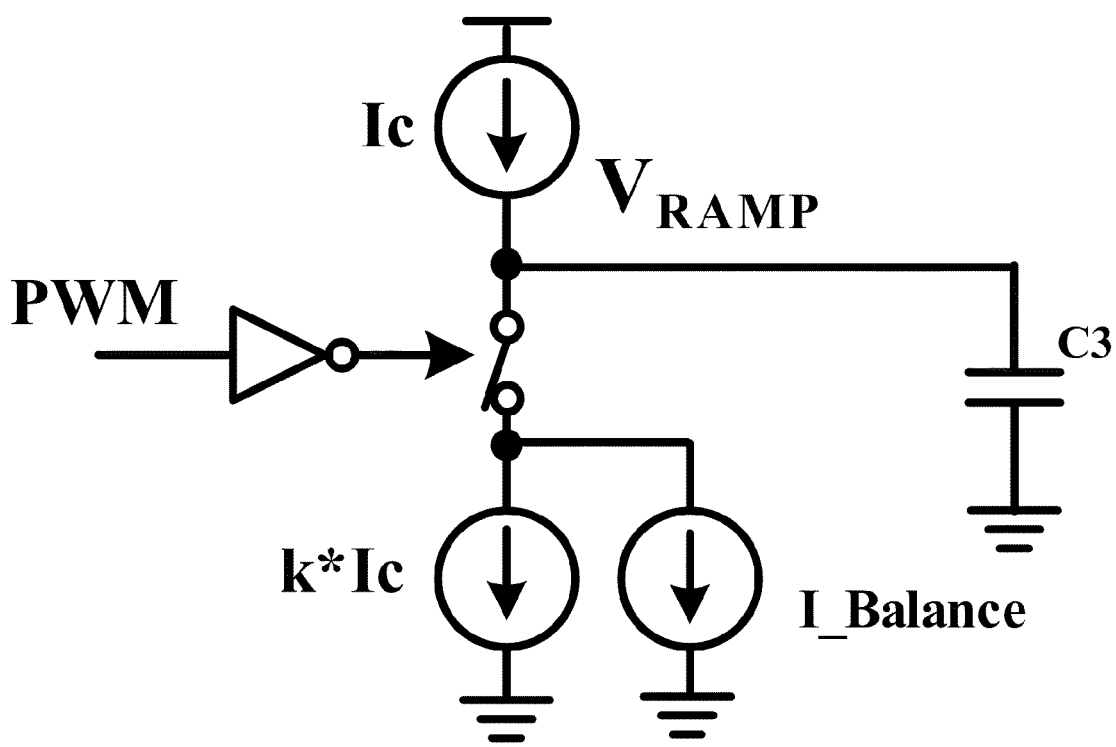
FIG. 10 illustrates circuitry including a one switch implementation of a linear pulse width modulation extension scheme, in accordance with an embodiment.

FIG. 10 illustrates circuitry 1000 of an embodiment including a one switch implementation similar to the linear pulse width modulation extension scheme discussed above with respect to FIG. 8, except that the charging of capacitor C3 is never disconnected. In this case, the k factor is made larger than 1 to ensure that the capacitor C3 can be discharged.

The circuitry illustrated by FIGS. 5, 8, and 10 utilizes a dual-ramp approach, in which the capacitor used for generating the voltage ramp signal $V_{RAMP}$ is gradually charged and discharged. In other embodiments, a single ramp approach can be used for generating $V_{RAMP}$. During the single ramp approach, the capacitor is charged gradually but discharged instantaneously, or almost instantaneously. Further, the PWM input pulse can be measured and used to adjust an amount of extension time based on a current balance condition. In one embodiment, the amount of extension time can be adjusted by altering ramp currents, voltage bias levels, etc.

Figure 11:
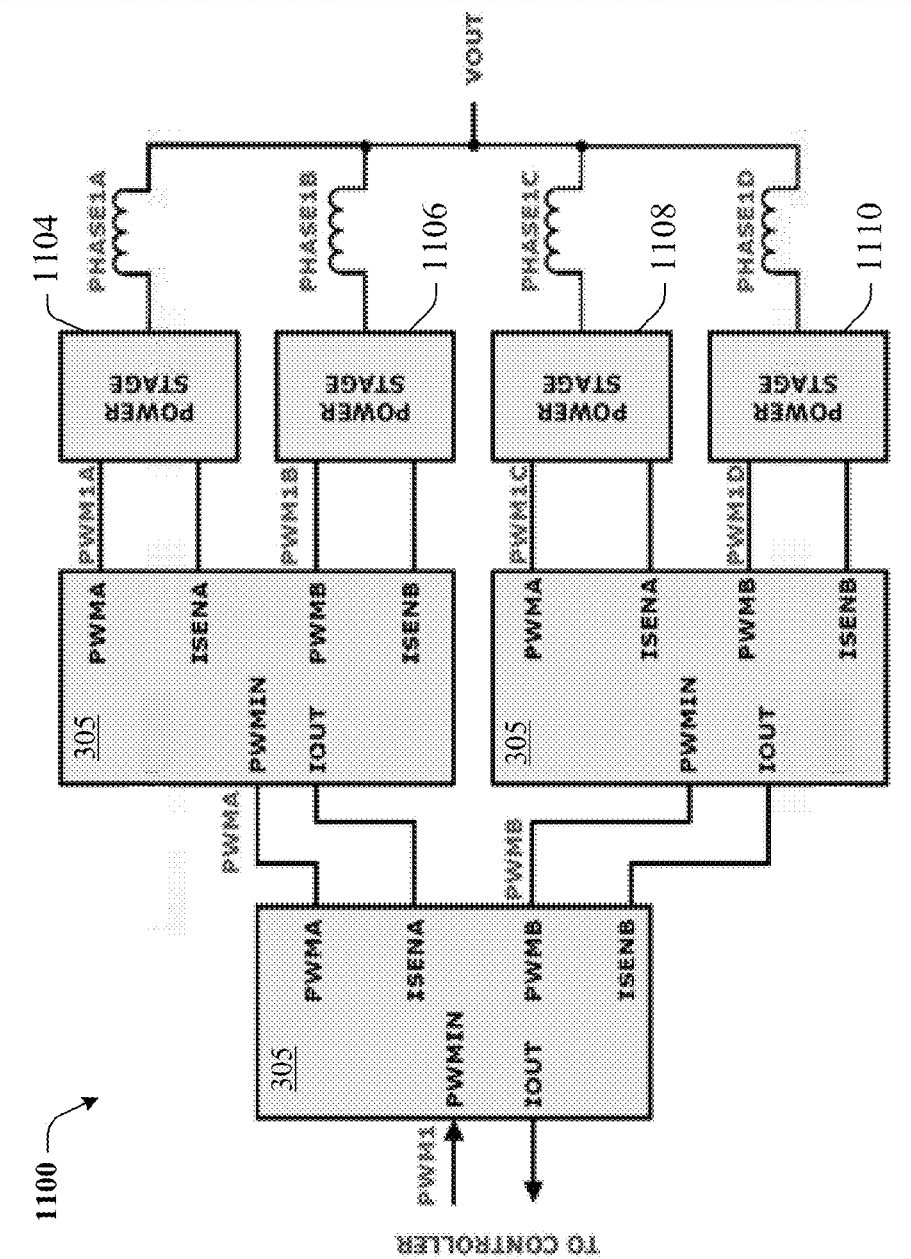
FIG. 11 illustrates a block diagram of a power supply, in accordance with an embodiment.
Figure 12:
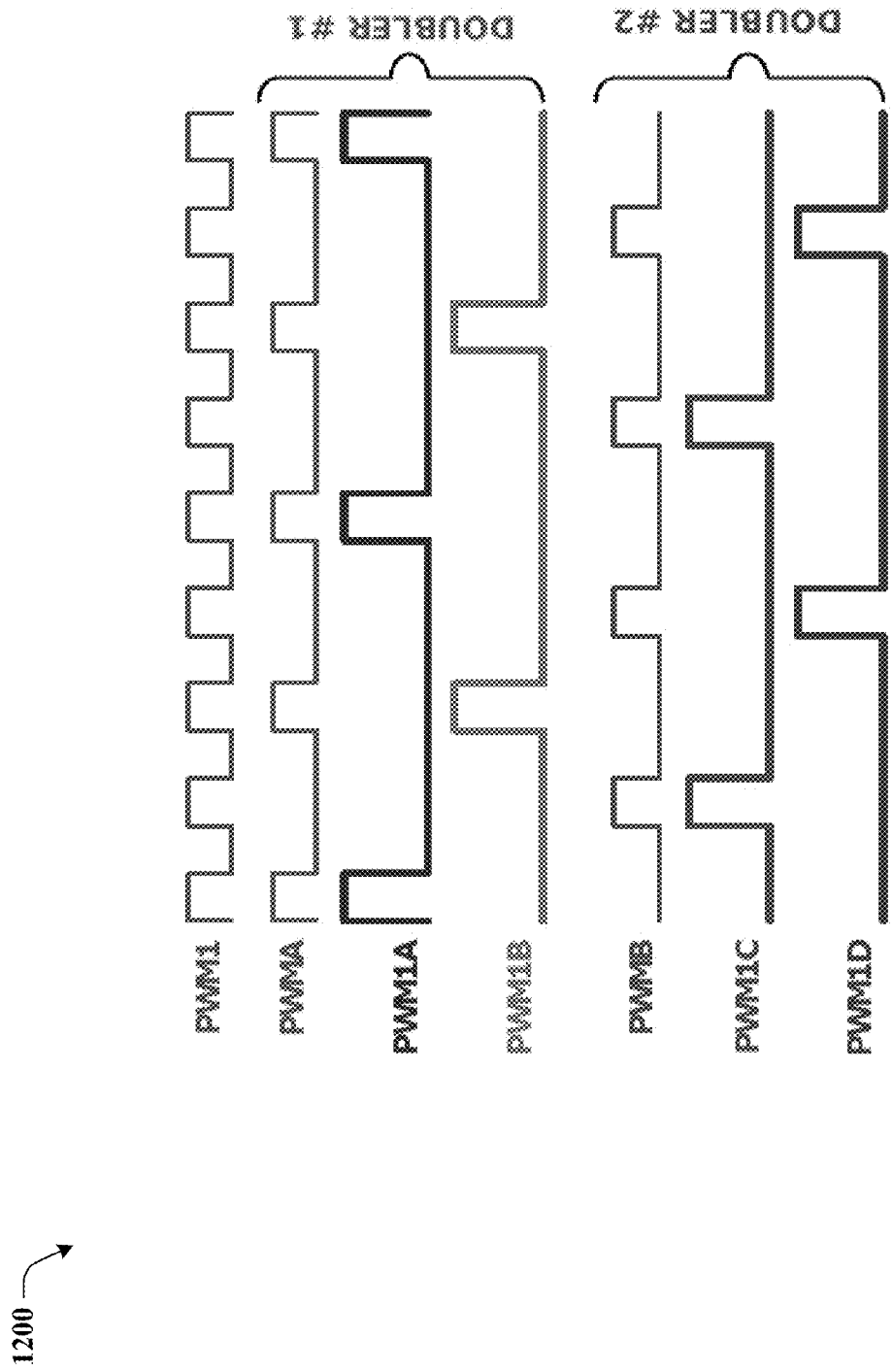
FIG. 12 illustrates waveforms associated with the power supply of FIG. 11, in accordance with an embodiment.

Referring now to FIGS. 11 and 12, block diagrams for a power supply 1100 including a cascaded configuration of phase doublers 305 and associated waveforms 1200 are illustrated, respectively, in accordance with an embodiment. As illustrated by FIG. 11, power supply 1100 can include three phase doublers 305 in a cascade arrangement, which can support four power stages 1104, 1106, 1108 and 1110. In an embodiment, such power stages can be similar to power stage component 220 and/or power stages 320/330 described above. FIG. 12 illustrates a set of exemplary voltage input and output waveforms 1200 that can be generated via cascaded phase doublers 305 of power supply 1100. As such, cascaded phase doublers 305 can implement linear pulse width modulation extension schemes described above via power trains PWMA, PWM1A, PWMB, PWM1B, PWM1C, and PWM1D, e.g., utilizing phase component 310 and current sense component 315. In an embodiment, cascaded phase doublers 305 of power supply 1100 can be implemented on a single mixed-signal IC. In another embodiment, cascaded phase doublers 305 can be implemented via multiple ICs.

Figure 13:
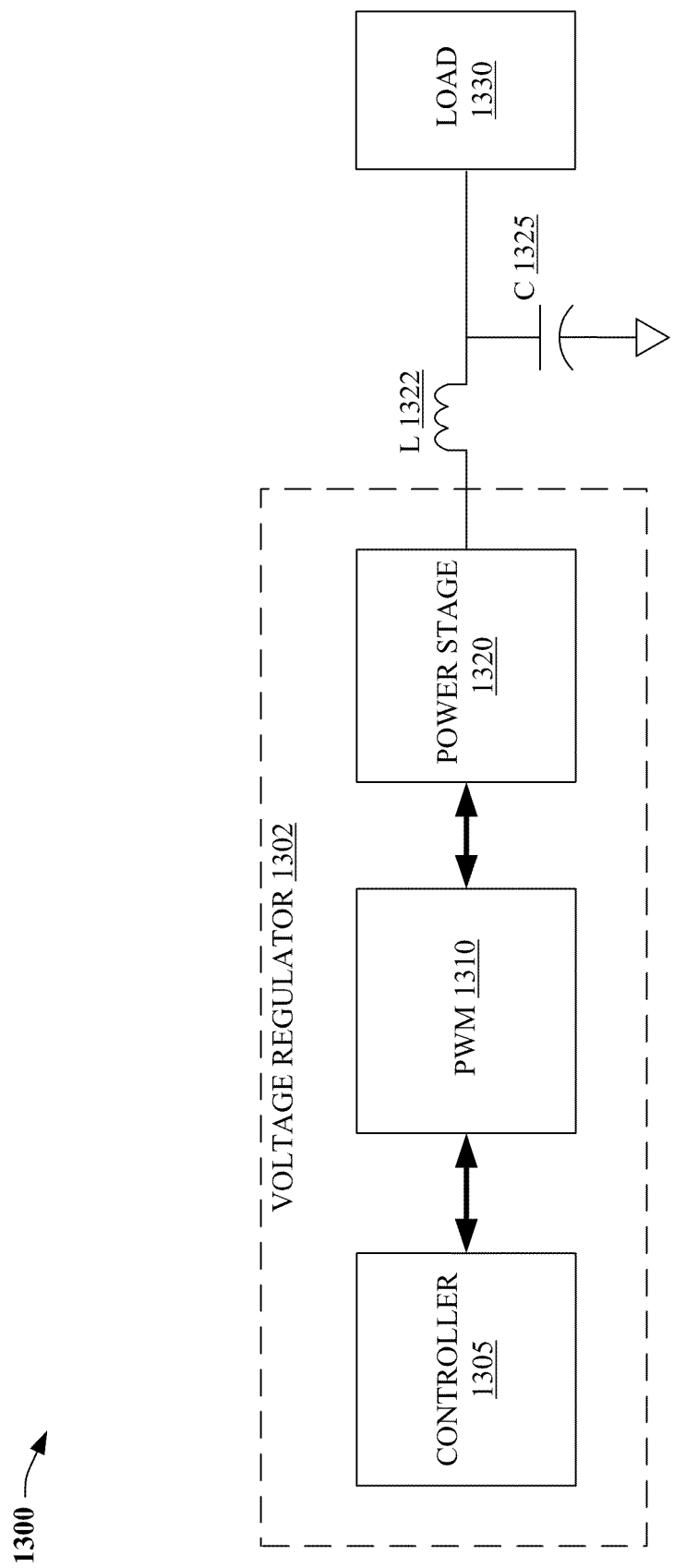
FIG. 13 illustrates an exemplary voltage regulator, in accordance with an embodiment.

FIG. 13 illustrates an exemplary voltage regulator 1302, in accordance with an embodiment. Voltage regulator 1302 can include controller 1305, which can include, for example, processor(s), logic, etc. configured to control pulse width modulator 1310. Pulse width modulator 1310 can include, e.g., 110, 205, 305, etc. and can be coupled to power stage 1320, e.g., 120, 220, 320-330, etc. for sourcing voltage and/or current to load 1330. Load 1330 can represent, for example, a microprocessor, IC, logic, and/or other apparatus requiring power, e.g., via a regulated voltage. Inductor 1322 and capacitance 1325 can be associated with energy storage and filter the output voltage to a "direct current" (DC) level.

In one embodiment, controller 1305 can be configured to generate a pulse width modulated (PWM) signal based on at least one feedback signal associated with an output voltage and/or an output current. Further, pulse width modulator 1310 can be configured to receive the PWM signal and extend a pulse width of a power train in proportion to a pulse width of the PWM signal. Furthermore, power stage 1320 can be configured to receive the power train and generate the output voltage and/or the output current based on the power train. In another embodiment, power stage 1320 can be coupled to load 1330 and source the output voltage and/or the output current via load 1330.

In yet another embodiment, pulse width modulator 1310 can be configured to modify the pulse width of the power train based on a predetermined maximum pulse width. In one embodiment, pulse width modulator 1310 can include a sense component (not shown) configured to generate the at least one feedback signal. The at least one feedback signal can include a sensed voltage associated with the output voltage and/or a sensed current associated with the output voltage. Further, the pulse width modulator can generate the pulse width of the power train based on the sensed voltage and/or the sensed current, e.g., to provide a regulated voltage output and/or a regulated current output.

In another embodiment, the pulse width modulator can generate a pulse width of an other power train opposite in phase to the pulse width of the power train. Further, the power stage can receive the other power train and generate the output voltage and/or the output current based on the other power train.

Figure 14:
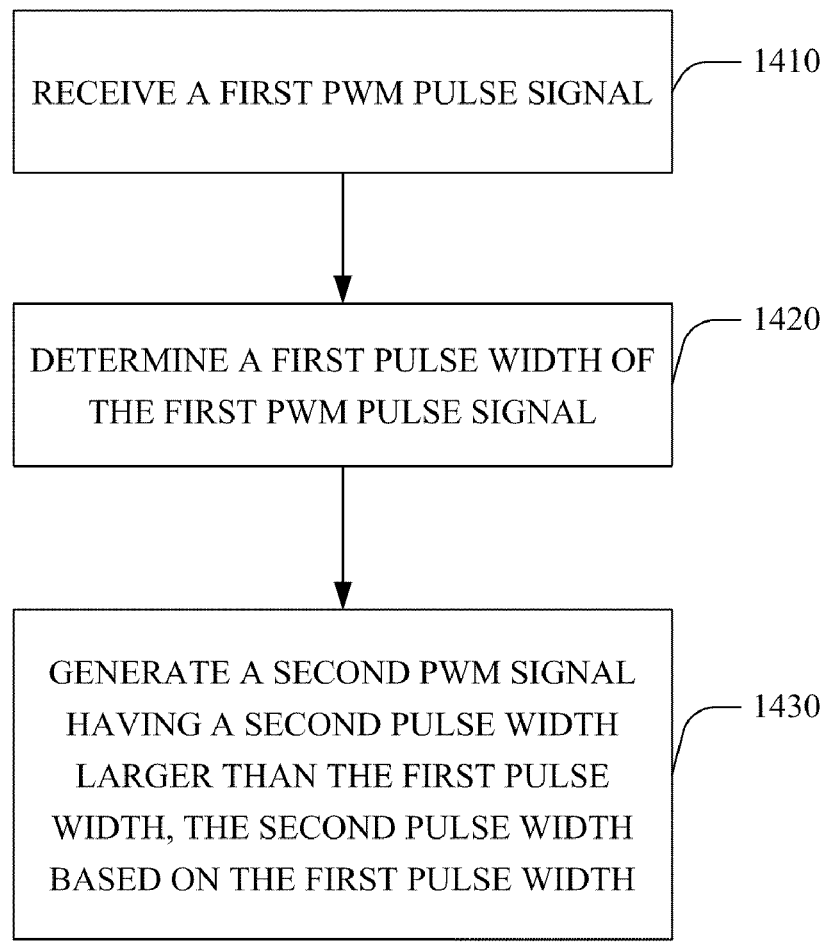
FIGS. 14-15 illustrate methods for adaptively modifying a pulse width of an output of a pulse width modulator, in accordance with an embodiment.
Figure 15:
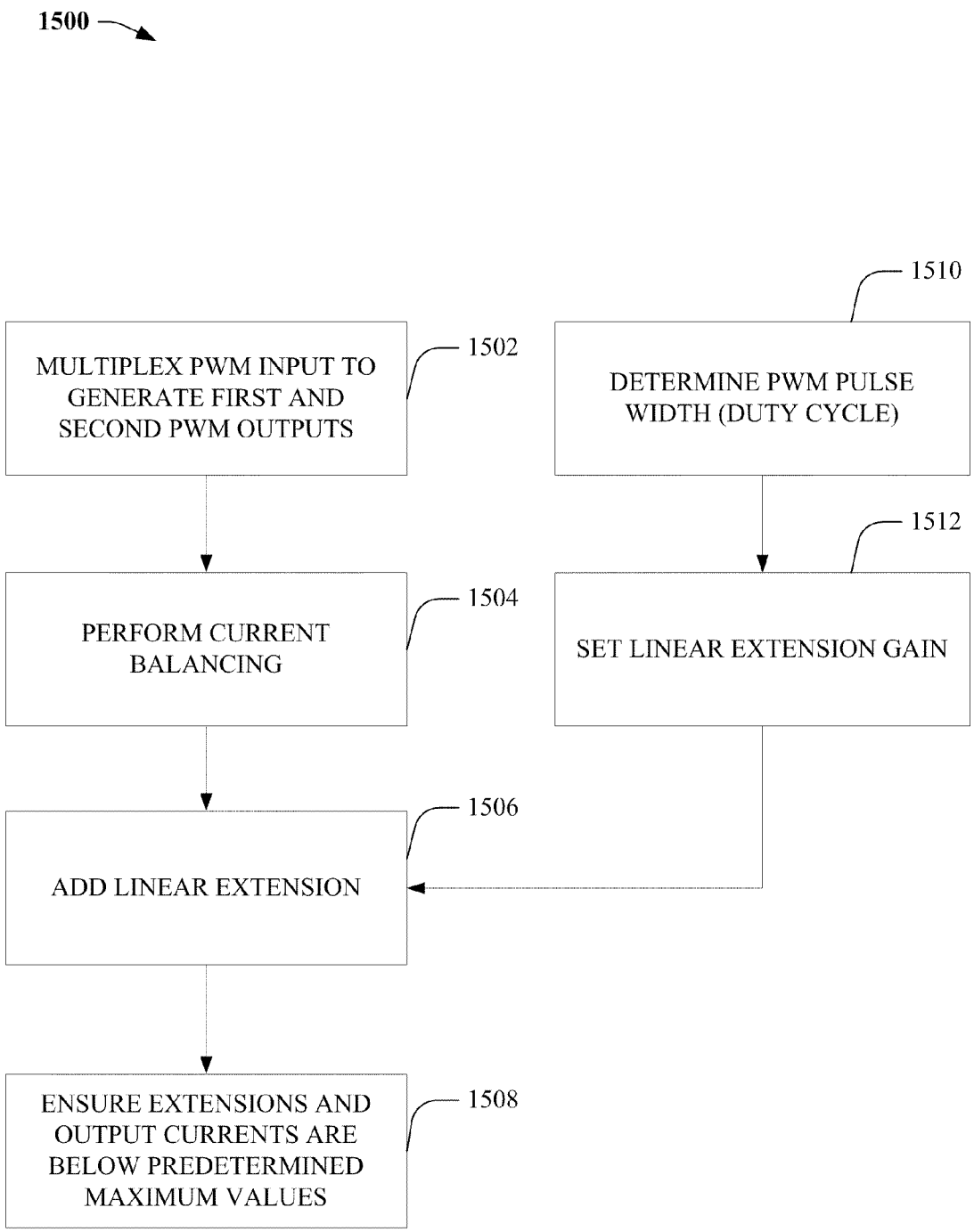

FIGS. 14-15 illustrate methodologies in accordance with the disclosed subject matter. For simplicity of explanation, the methodologies are depicted and described as a series of acts. It is to be understood and appreciated that the subject innovation is not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on firmware and/or software, and/or are capable of being executed via analog and/or digital components including ICs, discrete circuit devices and components, ASICs, FPGAs, microcontrollers, central processing units, etc.

Referring now to FIG. 14, a process 1400 for adaptively modifying a pulse width of an output of a pulse width modulator is illustrated, in accordance with an embodiment. At 1410, a first PWM pulse signal can be received by the pulse width modulator, e.g., pulse width modulator 205 or phase doubler 305. At step 1420, a first pulse width of the first PWM pulse signal can be determined by the pulse width modulator. The pulse width modulator can generate, at 1430, a second PWM pulse signal having a second pulse width larger than the first pulse width, the second pulse width based on the first pulse width. In one embodiment, the second pulse width can be linearly increased by the pulse width modulator as a function of the first pulse width.

FIG. 15 illustrates a process 1500 associated with a linear pulse width modulation extension scheme, e.g., that can be implemented by phase doubler 305, in accordance with an embodiment. At 1502, an input PWM signal can be converted, or multiplexed, into two complimentary output PWM signals via phase doubler 305. Current balancing can be performed, at 1504, to ensure that both output PWM signals of phase doubler 305 generate the same, or substantially the same, e.g., within a predetermined threshold, level of current. Such current balancing can be performed by controllably extending the width of an output PWM signal that generates a lower current, compared with a current generated by a PWM output signal complementary to the output PWM signal—the width of the output PWM signal extended by an amount, or an extension time, causing the output PWM signal to generate (or caused to be generated) a current level the same as, or substantially similar to, e.g., within a predefined threshold, a current level generated (or caused to be generated) by the complimentary output PWM signal.

At 1506, one or more extensions can be added to output PWM signals of phase doubler 305 by using techniques discussed above. Phase doubler 305 can measure the PWM input pulse width, or duty cycle, at 1510. At 1512, phase doubler 305 can linearly adjust an extension time of the one or more extensions based on the measured PWM input pulse width. As such, linear extensions to the output PWM signals can be proportional to the pulse widths of the input PWM signal, and increase linearly as a function of the measured PWM input pulse widths.

At 1508, phase doubler 305 can ensure that such extensions are below a predetermined maximum allowable extension length (or duty cycle), and the output currents remain below a maximum allowable current value. In an embodiment, the maximum allowable extension length, and/or the maximum allowable current value, can be user programmable or predetermined by a system designer. For example, upon a maximum allowable extension length or a maximum allowable current value being reached, phase doubler 305 can cause an output PWM pulse to switch from HIGH to LOW, thereby effectively temporarily shutting of the output power train if the extension exceeds the maximum allowable length for a pulse, or if the output current exceeds the maximum allowable current value.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used, or modifications and additions can be made to the described embodiments, for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

The aforementioned systems/circuits have been described with respect to interaction between several components. It can be appreciated that such systems/circuits and components can include those components or specified sub-components, some of the specified components or sub-components, and/or additional components, and according to various permutations and combinations of the foregoing. Sub-components can also be implemented as components communicatively coupled to other components rather than included within parent components, e.g., in a hierarchical fashion. Additionally, it should be noted that one or more components may be combined into a single component providing aggregate functionality or divided into several separate sub-components; and any one or more middle layers, such as a management layer, may be provided to communicatively couple to such sub-components in order to provide integrated functionality. Any components described herein may also interact with one or more other components not specifically described herein, but generally known by those of skill in the art.

What is claimed is:

1. A method, comprising:
   receiving a first pulse width modulated (PWM) pulse signal;
   determining a first pulse width of the first PWM pulse signal; and
   first generating a second PWM pulse signal having a second pulse width larger than the first pulse width, wherein the second pulse width is equal to a sum of the first pulse width and an extension time, wherein the extension time is based on the first pulse width.

2. The method of claim 1, wherein the first generating the second PWM pulse signal further includes generating the second PWM pulse signal having the extension time_larger for a larger first pulse width than for a smaller first pulse width.

3. The method of claim 1, wherein the first generating the second PWM pulse signal further includes generating the second PWM pulse signal having the extension time increase linearly as a function of the first pulse width.

4. The method of claim 1, further comprising:
   limiting the second pulse width based on a predetermined maximum pulse width.

5. The method of claim 1, further comprising:
   switching a pulse of the second PWM pulse signal from a high level to a low level if a current generated via the second PWM pulse signal exceeds a predetermined maximum current, wherein the second PWM pulse signal at least one of stops generating or limits the current if the pulse is switched from the high level to the low level.

6. The method of claim 1, further comprising:
   second generating a third PWM pulse signal having a third pulse width;
   comparing a current level generated via the second PWM pulse signal with a current level generated via the third PWM pulse signal; and
   adjusting a pulse width of the second PWM pulse signal or a pulse width of the third PWM pulse signal to cause the current level generated via the second PWM pulse signal to be substantially the same as the current level generated via the third PWM pulse signal.

7. The method of claim 6, wherein the first generating the second PWM pulse signal further includes generating the second PWM pulse signal by multiplexing the first PWM pulse signal, and wherein the second generating the third PWM pulse signal further includes generating the third PWM pulse signal by multiplexing the first PWM pulse signal.

8. The method of claim 6, wherein the first generating the second PWM pulse signal further includes generating the second PWM pulse signal having the extension time increase linearly as a function of the first pulse width, and wherein the second generating the third PWM pulse signal further includes generating the third PWM pulse signal having the third pulse width increase linearly as a function of the first pulse width.

9. The method of claim 6, further comprising:
   limiting at least one of the second pulse width or the third pulse width based on a predetermined maximum pulse width.

10. The method of claim 6, further comprising:
    switching a pulse of the second PWM pulse signal from a high level to a low level if a first current generated via the second PWM pulse signal exceeds a first predetermined maximum current, wherein the second PWM pulse signal at least one of stops or limits the first current if the pulse of the second PWM pulse signal is switched from the high level to the low level; and
    switching a pulse of the third PWM pulse signal from the high level to the low level if a second current generated via the third PWM pulse signal exceeds a second predetermined maximum current, wherein the third PWM pulse signal at least one of stops or limits the second current if the pulse of the third PWM pulse signal is switched from the high level to the low level.

11. An apparatus, comprising:
    a phase component configured to adaptively modify an extension time to be added to pulse widths of a first pulse width modulated (PWM) output signal based on pulse widths of a PWM input signal, wherein the extension time is longer for longer pulse widths of the PWM input signal; and
    a power stage component configured to source at least one of a voltage or a current to a load based on the first PWM output signal.

12. The apparatus of claim 11, wherein the phase component is further configured to linearly extend the pulse width of the first PWM output signal based on the pulse width of the PWM input signal.

13. The apparatus of claim 11, wherein the phase component is further configured to adaptively modify the pulse width of the first PWM output signal based on a predetermined maximum pulse width.

14. The apparatus of claim 11, further comprising:
    a current sense component configured to measure a current associated with the first PWM output signal, wherein the phase component is further configured to adaptively modify the pulse width of the first PWM output signal based on the current.

15. The apparatus of claim 11, wherein the phase component is further configured to adaptively modify a pulse width of a second PWM output signal based on the pulse width of the PWM input signal, wherein a phase of the second PWM output signal is opposite to a phase of the first PWM output signal, and wherein the power stage component is further configured to source the at least one of the voltage or the current to the load based on the second PWM output signal.

16. The apparatus of claim 15, further comprising:
a current sense component configured to:
  measure a first current associated with the first PWM output signal; and
  measure a second current associated with the second PWM output signal,
wherein the phase component is further configured to adaptively modify the pulse width of the first PWM output signal or the pulse width of the second PWM output signal based on the first current and the second current.

17. The apparatus of claim 15, wherein the phase component is further configured to generate the first PWM output signal and the second PWM output signal by multiplexing the PWM input signal.

18. The apparatus of claim 15, wherein the phase component is further configured to linearly extend the pulse width of at least one of the first PWM output signal or the second PWM output signal based on the pulse width of the PWM input signal.

19. The apparatus of claim 15, wherein the phase component is further configured to limit the pulse width of at least one of the first PWM output signal or the second PWM output signal based on a predetermined maximum pulse width.

20. A system, comprising:
a controller configured to generate a pulse width modulated (PWM) signal based on at least one feedback signal associated with at least one of an output voltage or an output current;
a pulse width modulator configured to:
  receive the PWM signal; and
  extend a pulse width of a power train in proportion to a pulse width of the PWM signal; and
a power stage configured to:
  receive the power train; and
  generate at least one of the output voltage or the output current based on the power train.

21. The system of claim 20, further comprising:
a load coupled to the power stage, wherein power stage is further configured to source the at least one of the output voltage or the output current via the load.

22. The system of claim 20, wherein the pulse width modulator is further configured to modify the pulse width of the power train based on a predetermined maximum pulse width.

23. The system of claim 20, further comprising:
a sense component configured to generate the at least one feedback signal, wherein the at least one feedback signal includes at least one of a sensed voltage or a sensed current, wherein the at least one of the sensed voltage or the sensed current is associated with the at least one of the output voltage or the output current, and wherein the pulse width modulator is further configured to generate the pulse width of the power train based on the at least one of the sensed voltage or the sensed current.

24. The system of claim 20, wherein the pulse width modulator is further configured to generate a pulse width of an other power train opposite in phase to the pulse width of the power train, wherein the power stage is further configured to receive the other power train and generate the at least one of the output voltage or the output current based on the other power train.

* * * * *